US012542252B1

(12) United States Patent
Gamm et al.

(10) Patent No.: US 12,542,252 B1
(45) Date of Patent: Feb. 3, 2026

(54) METHOD OF OPERATING A PARTICLE BEAM SYSTEM, PARTICLE BEAM SYSTEM, NON-TRANSITORY STORAGE MEDIUM AND PROGRAM

(71) Applicant: Carl Zeiss Microscopy GmbH, Jena (DE)

(72) Inventors: Björn Gamm, Koenigsbronn (DE); Rainer Arnold, Thalfingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 413 days.

(21) Appl. No.: 18/164,379

(22) Filed: Feb. 3, 2023

Related U.S. Application Data

(63) Continuation of application No. 18/159,915, filed on Jan. 26, 2023, now abandoned.

(51) Int. Cl.
*H01J 37/145* (2006.01)
*H01J 37/244* (2006.01)

(52) U.S. Cl.
CPC .......... *H01J 37/145* (2013.01); *H01J 37/244* (2013.01); *H01J 2237/2448* (2013.01); *H01J 2237/24578* (2013.01)

(58) Field of Classification Search
CPC ........ H01J 37/265; H01J 37/244; H01J 37/28; H01J 2237/221; H01J 2237/2443; H01J 2237/2801; H01J 2237/2814; H01J 2237/0432; H01J 37/045
See application file for complete search history.

(56) References Cited

U.S. PATENT DOCUMENTS

| | | | | | |
|---|---|---|---|---|---|
| 4,933,553 | A * | 6/1990 | Tomizawa | H01J 37/153 | 250/397 |
| 5,032,725 | A * | 7/1991 | Kanda | H01J 37/21 | 250/311 |
| 5,466,940 | A * | 11/1995 | Litman | H01J 37/244 | 250/397 |
| 6,107,637 | A * | 8/2000 | Watanabe | H01J 37/222 | 250/548 |
| 7,851,754 | B2 * | 12/2010 | Komuro | H01J 37/268 | 250/311 |
| 11,328,895 | B2 * | 5/2022 | Floresca | H01J 37/21 | |
| 2002/0134949 | A1 * | 9/2002 | Gerlach | H01J 37/08 | 250/251 |
| 2003/0075691 | A1 * | 4/2003 | Abe | H01J 37/21 | 250/398 |
| 2003/0197906 | A1 * | 10/2003 | Furuta | G11B 7/13922 | |

(Continued)

*Primary Examiner* — David A Vanore
(74) *Attorney, Agent, or Firm* — Fish & Richardson P.C.

(57) ABSTRACT

A method of operating a particle beam system comprises positioning a sample at a given distance away from a lens focusing a particle beam; performing a measurement for each selected energization of a plurality of measurement energizations, wherein each measurement comprises recording a value derived from a reading of an electron detector, while the lens is energized with a selected measurement energization; and analyzing a dependency of the recorded values from the plurality of measurement energizations. Herein analyzing is based on a dependency of the number of electrons incident on the electron detector per unit time from the distance of the sample from the lens and from the energization of the lens.

14 Claims, 5 Drawing Sheets

(56) References Cited

U.S. PATENT DOCUMENTS

| | | | | |
|---|---|---|---|---|
| 2006/0060775 | A1* | 3/2006 | Sakakibara | B82Y 10/00 250/307 |
| 2006/0097166 | A1* | 5/2006 | Ishitani | H01J 37/28 250/492.21 |
| 2008/0113218 | A1* | 5/2008 | Schlichting | C23C 28/345 428/701 |
| 2008/0308742 | A1* | 12/2008 | Gerlach | H01J 37/28 250/397 |
| 2011/0140729 | A1* | 6/2011 | Nakamura | H01J 37/28 324/762.01 |
| 2011/0188735 | A1* | 8/2011 | Hosoya | G06T 7/001 382/149 |
| 2011/0274341 | A1* | 11/2011 | Shirahata | H01J 37/28 382/145 |
| 2013/0320210 | A1* | 12/2013 | Yamada | H01J 37/1471 250/307 |
| 2014/0361167 | A1* | 12/2014 | Morishita | H01J 37/28 250/310 |
| 2016/0240348 | A1* | 8/2016 | Yokosuka | H01J 37/20 |
| 2019/0172676 | A1* | 6/2019 | Nakano | H01J 37/222 |
| 2019/0362929 | A1* | 11/2019 | Yamamoto | H01J 37/145 |
| 2020/0111638 | A1* | 4/2020 | Araki | H01J 37/243 |
| 2022/0351938 | A1* | 11/2022 | Nakamura | H01J 37/265 |

* cited by examiner

METHOD OF OPERATING A PARTICLE BEAM SYSTEM, PARTICLE BEAM SYSTEM, NON-TRANSITORY STORAGE MEDIUM AND PROGRAM

CROSS-REFERENCE TO RELATED APPLICATIONS

This application is a continuation application of and claims the benefit of priority to U.S. application Ser. No. 18/159,915, filed on Jan. 26, 2023, the contents of which are hereby incorporated by reference.

FIELD

The present disclosure relates to a method of operating a particle beam system, a particle beam system, a non-transitory storage medium of a particle beam system and a program executed by a particle beam system.

BACKGROUND

Conventionally, a particle beam system, such as an electron microscope, can be used to acquire data by directing a particle beam of the particle beam system to different points on a sample in the particle beam system. For this purpose, it is generally desirable for the particle beam to irradiate an area on the sample, also known as the particle beam spot, that is as small as reasonably possible. This can be achieved, for example, by focusing the particle beam by changing an energization of an objective lens of the particle beam system, or by changing the vertical position of the sample, such that the particle beam spot is minimal.

Some conventional methods to reduce (e.g., minimize) the particle beam spot acquire a plurality of images with different energizations of the objective lens, or different vertical positions of the sample. The images of the plurality of images can then be compared to each other, such that an energization of the objective lens or the vertical position of the sample can be changed based on the comparison in a way that the particle beam spot is minimized iteratively. The comparison of the images can be performed with regard to a sharpness of the images, which can be, for example, determined from gradients between pixels of an image.

SUMMARY

In some situations, certain conventional methods are inefficient or fail to properly yield a desired particle beam spot.

The present disclosure seeks to provide a relatively efficient and successful method of operating a particle beam system.

In an aspect, the disclosure provides a method of operating a particle beam system performed by a particle beam system. The particle beam system comprises at least a particle beam source configured to generate a particle beam, and a lens configured to focus the particle beam in a focal plane. The lens includes a front electrode closest to the focal plane. The front electrode has an aperture traversed by the particle beam. A distance between the front electrode and the focal plane is a working distance. An energization of the lens is adjustable to adjust the working distance. The particle beam system also comprises a sample holder configured to hold a sample at a distance from the lens, and an electron detector arranged, when seen along a beam path of the particle beam, between the particle beam source and the front electrode such that electrons originating from the sample and having traversed the aperture of the front electrode can be incident on the electron detector. The electron detector is configured to generate readings representing a number of electrons incident on the electron detector per unit time. The number of electrons incident on the electron detector per unit time depends on the distance of the sample from the lens and on the energization of the lens, while the sample is irradiated by a same current of the particle beam. The method of operating the particle beam system comprises setting initial settings of the particle beam system, and performing a measurement for each selected setting of a plurality of measurement settings. Each measurement comprises recording a value derived from a reading of the electron detector. The method also includes analyzing a dependency of the recorded values from the plurality of measurement settings. Analyzing is based on the dependency of the number of electrons incident on the electron detector per unit time from the distance of the sample from the lens and from the energization of the lens.

An electron detector arranged as described above can be referred to as an in-lens detector, as it detects electrons entering the lens. The readings of the electron detector can be represented by intensity values in further processing steps, but are not limited to being represented by intensity values. For example, the readings of the electron detector can also be represented by a contrast setting of the particle beam system.

When the particle beam of the particle beam system is incident on the sample, the sample can emit secondary electrons. These secondary electrons can be drawn into the opening of the lens by an electromagnetic field, such that they pass near the particle beam until they are incident on the electron detector. Thus, if the sample is further away from the lens, less electrons can be drawn into the opening of the lens. In addition, the secondary electrons passing through the opening of the lens can be subject to the electromagnetic interaction with the particle beam and/or the interaction with the electromagnetic and/or electrostatic fields of the lens and other components. Therefore, the number of electrons incident on the electron detector per unit time can depend on the distance of the sample from the lens and on the energization of the lens. For example, this also means that the dependency can be significant, meaning that the number of electrons incident on the electron detector per unit time can be significantly lower for large distances of the sample from the lens and specific energizations of the lens than for small distances of the sample from the lens and other specific energizations of the lens. Furthermore, the dependency between the number of electrons incident on the electron detector and the distance of the sample from the lens and the working distance can be a two-dimensional dependency. A two dimensional dependency is characterized by a varying functional behavior in two dimensions that are both not constant. If a dimension with constant functional behavior can be found, the dependency is referred to as a one-dimensional dependency.

According to some embodiments, the electron detector has an electron detecting substrate arranged adjacent to the particle beam. The electron detecting substrate includes any kind of material in which a physical process is triggered when an electron is incident on the material, the physical process leading to a detection of the electron. The electron detecting substrate can be, for example, a scintillator crystal included in the electron detector. The electron detector may further comprise other elements, such as fixtures and the like. In addition, the electron detecting substrate can be arranged adjacent to the particle beam such that it does not block the particle beam.

According to some embodiments, the number of electrons incident on the electron detector per unit time further depends on a direction under which the particle beam is directed onto the sample. Performing the measurement for each selected setting of the plurality of measurement settings can comprise performing of a first measurement for each selected setting of the plurality of measurement settings with the particle beam being directed in a first direction, and performing of a second measurement for each selected setting of the plurality of measurement settings with the particle beam being directed in a second direction that is different from the first direction. Analyzing can be further based on the dependency of the number of electrons incident on the electron detector per unit time from the direction under which the particle beam is directed onto the sample. For example, the particle beam system can include a deflection mechanism to deflect the particle beam in various directions, such that it can be scanned across the sample. Thus, the direction under which the particle beam is directed onto the sample can correspond to the direction in which the particle beam is deflected by the deflection mechanism. Secondary electrons emitted from the sample are typically less likely to traverse an opening of the electron detecting substrate when the particle beam is deflected under a large angle such that is it is incident on the sample at a point that is far away from an optical axis of the particle beam system. Thus, the number of electrons incident of the electron detector per unit time can further depend on the direction under which the particle beam is directed onto the sample. This dependency of the number of electrons incident on the electron detector per unit time is a three-dimensional dependency, characterized by the fact that no constant functional behavior can be found in any of the three dimensions. This dependency can be significant, similar to the above. It can also be said that in this case, the performed measurements are different for different incidence locations of the particle beam on the sample surface, while every other setting of the particle beam system is held constant. Thus, different measurements can be performed for different incidence locations of the particle beam on the sample surface to obtain additional information about the dependency. In some embodiments, the first measurement with the particle beam being directed in the first direction can be first performed for each selected setting of the plurality of measurement settings. Afterwards, the second measurement with the particle beam being directed in the second direction can be performed for each selected setting of the plurality of measurement settings. In other embodiments, the first and second measurements can be performed in an alternating order, such that a measurement of a first selected setting and the first direction is performed first, then a measurement of the first selected setting and the second direction is performed, and so on.

According to some embodiments, the measurement settings of the method for operating the particle beam system are represented by measurement energizations. In this case, the setting of initial settings of the particle beam system can comprise positioning the sample on the sample holder such that it is arranged at a given distance away from the lens, performing a measurement for each selected energization of a plurality of measurement energizations, wherein each measurement comprises recording a value derived from a reading of the electron detector, while the lens is energized with the selected measurement energization, and analyzing a dependency of the recorded values from the plurality of measurement energizations. The analysis of the dependency of the recorded values from the plurality of measurement energizations can be based on the dependency of the number of electrons incident on the electron detector per unit time from the distance of the sample from the lens and from the energization of the lens, which is a two-dimensional dependency. Since the dependency of the number of electrons incident on the electron detector per unit time from the distance of the sample from the lens and from the energization of the lens is the underlying dependency of the physical principle, it can provide information on a currently measured dependency of the recorded values from the plurality of measurement energizations.

According to some embodiments, the measurement settings of the method of operating the particle beam system are represented by measurement positions of the sample of the particle beam system. In this case, the sample holder of the particle beam system can be configured to hold the sample at a distance from the lens, wherein the sample holder can be operated to change a position of the sample in order to adjust the distance of the sample from the lens. The method then can comprise energizing the lens with a given energization to focus the particle beam in a plane arranged at a given working distance away from the lens, performing a measurement for each selected position of a plurality of measurement positions of the sample, wherein each measurement comprises recording a value derived from a reading of the electron detector, while the sample is located at the selected position, and analyzing a dependency of the recorded values from the plurality of measurement positions of the sample. The analysis can be based on the dependency of the number of electrons incident on the electron detector per unit time from the distance of the sample from the lens and from the energization of the lens. Those embodiments differ from the previously described embodiments in that the position of the sample is varied and the energization of the lens is fixed instead of the energization of the lens being varied and the position of the sample being fixed.

According to some embodiments, the method may further comprise a determining of a first target energization of the lens based on the analyzing of the dependency of the recorded values. This can be, for example, an energization of the lens at which the particle beam spot is relatively small. This energization of the lens can be determined during the analyzing of the dependency of the recorded values from the measurement energizations or the measurement positions. The method can further comprise performing a first task while the energization is maintained at the first target energization. Performing the first task can include, for example, acquiring an image by scanning the particle beam across the sample while recording readings of the electron detector. However, performing the first task can also include acquiring one-dimensional data by scanning the particle beam across the sample in a line while recording readings of the electron detector, or various other tasks that can be performed by the particle beam system. In some embodiments, the method may further comprise determining a first target position of the sample relative to the lens based on the analyzing of the dependency of the recorded values, and performing a first task while the position of the sample relative to the lens is maintained at the first target position. For example, the sample can be positioned such that the particle beam spot is relatively small, instead of changing the energization of the lens. Also in this case, the previously mentioned first tasks may be performed after determining the first target position.

According to some embodiments, the first task may include recording readings of the electron detector, determining a second target energization of the lens based on the recorded readings, and performing a second task while the energization is maintained at the second target energization. This means that the first task may also can include determining a refined target energization at which the particle beam spot is in fact minimal. The refined target energization can be obtained by acquiring multiple images for multiple energizations of the lens in a small range around the first target energization by scanning the particle beam across the sample while recording readings of the electron detector. The acquired images can be compared to each other by, for example, algorithms that analyze gradients between pixels of the image. In some embodiments, the first task may include determining a second target position of the sample relative to the lens based on analyzing the recorded readings and performing a second task while the position of the sample relative to the lens maintained at the second target position. This means that, instead of the energization of the lens, the sample position can be refined by acquiring additional images in a small range around the first target position. It is noted that the embodiments are not limited to selected combinations of target energizations or target positions. Specific embodiments may, for example, include the determining of the first target position of the sample relative to the lens based on the analyzing of the dependency of the recorded values, such that the position of the sample can be changed such that the particle beam spot is relatively small, and additionally the determining of the second target energization of the lens based on the recorded readings, such that minimizing the particle beam spot is then performed via the energization of the lens instead of the position of the sample. Further embodiments are possible in this regard. The second task may comprise, for example, acquiring an image by scanning the particle beam across the sample while recording readings of the electron detector.

According to some embodiments, the method may further comprise performing an experiment to determine the dependency of the number of electrons incident on the electron detector per unit time from the distance of the sample from the lens and from the energization of the lens. The experiment can be performed, for example, by repeatedly performing the above described method with known positions of the sample and known working distances generated by the energizations of the lens. In this case, the analysis of the dependency of the recorded values from the plurality of measurement settings may include identifying a recorded value that is nearest to the point at which the position of the sample equals the working distance generated by the energization of the lens, or identifying an interpolated value at this point. In this way, the underlying dependency of the number of electrons incident on the electron detector per unit time from the distance of the sample from the lens and from the energization of the lens can be determined beforehand, such that the results of the experiment can be used during the analysis of the dependency of the recorded values from the plurality of measurement energizations or the plurality of measurement positions when the method is executed at a later time. In some embodiments, the experiment can be performed to determine the dependency of the number of electrons incident on the electron detector per unit time from the distance of the sample from the lens, from the energization of the lens and from the direction under which the particle beam is incident on the sample.

According to some embodiments, the method may further comprise performing a simulation of the particle beam system to determine the dependency of the number of electrons incident on the electron detector per unit time from the distance of the sample from the lens and from the energization of the lens. The simulation may be a generation of values by a computer according to an estimated dependency of the number of electrons incident on the electron detector per unit time from the distance of the sample from the lens. In this way, the underlying dependency of the number of electrons incident on the electron detector per unit time from the distance of the sample from the lens and from the energization of the lens can be determined beforehand, such that the simulation can be used during the analyzing of the dependency of the recorded values from the plurality of measurement energizations or the plurality of measurement positions. In some embodiments, the simulation can be performed to determine the dependency of the number of electrons incident on the electron detector per unit time from the distance of the sample from the lens, from the energization of the lens and from the direction under which the particle beam is incident on the sample.

According to some embodiments, the particle beam system may further comprise a storage storing data representing the dependency of the number of electrons incident on the electron detector per unit time from the distance of the sample from the lens and from the energization of the lens from the storage of the particle beam system. In this case, analyzing may comprise reading the data from the storage. By reading the data from the storage, a simulation or an experiment according to various embodiments described above can be performed well before the remaining steps of the method.

According to some embodiments, the lens included in the particle system may further comprise a further electrode having an aperture traversed by the particle beam, wherein the further electrode is arranged at a distance from the front electrode. In such a case, the method may further comprise generating a focusing electric field between the front electrode and the further electrode, the focusing electric field contributing to the focusing of the particle beam. For example, the electric field between the front electrode and the further electrode can accelerate electrons emitted from the sample along the direction of the optical axis of the particle beam system.

According to some embodiments, the particle beam system may further comprise a controller, wherein the controller is configured to perform the method according to one of the embodiments described above.

According to some embodiments, a non-transitory computer-readable storage medium comprises instructions to cause a controller of the particle beam system to perform the method according to one of the embodiments described above.

According to some embodiments, the particle beam system is operated by a program that, upon execution by the controller of the particle beam system, performs the method according to one of the embodiments described above.

BRIEF DESCRIPTION OF THE DRAWINGS

The foregoing as well as other features of the disclosure are provided in the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
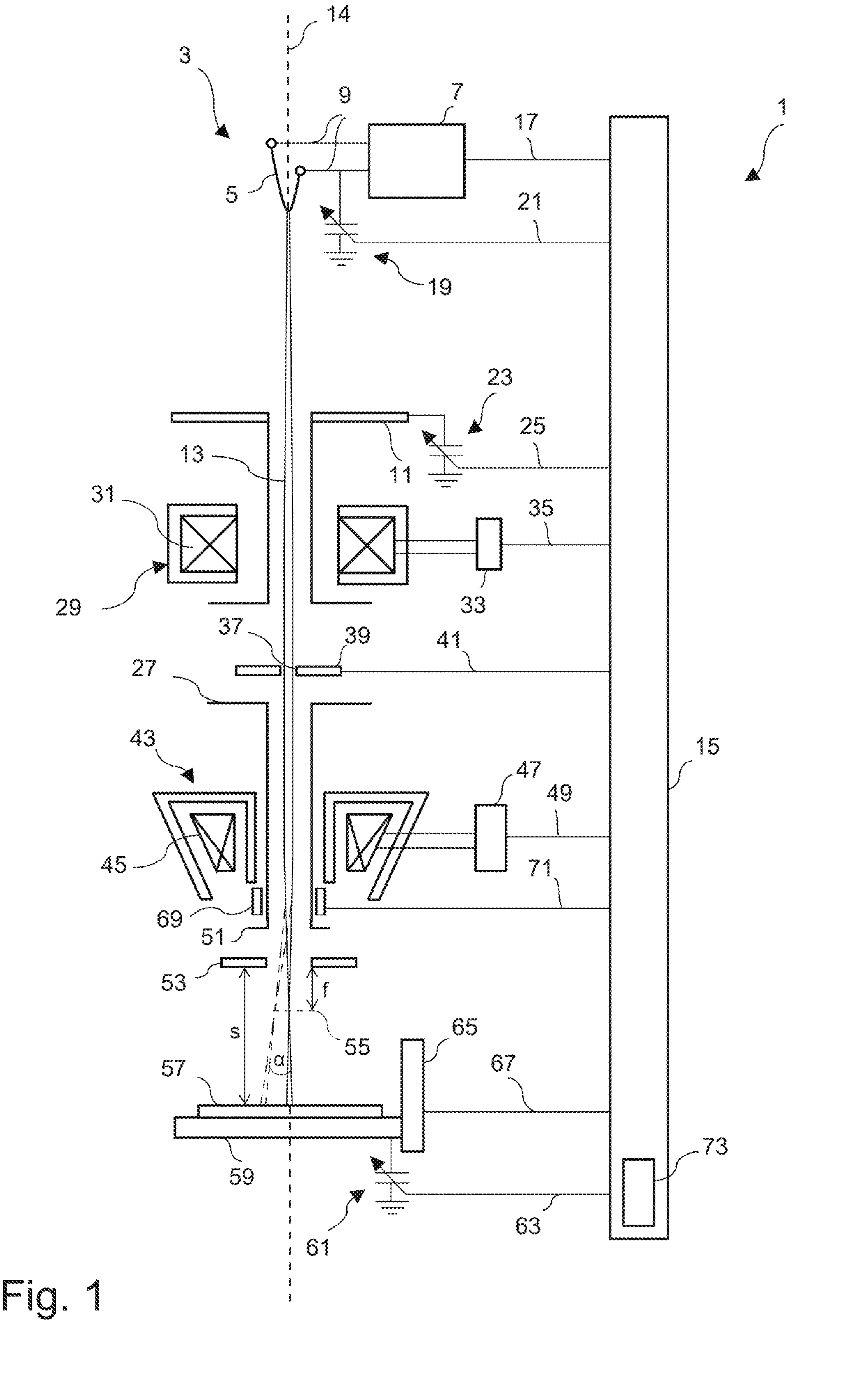
FIG. 1 shows a schematic view of a particle beam system.

In the exemplary embodiments described below, components that are alike in function and structure are designated as far as possible by alike reference numerals. Therefore, to understand the features of the individual components of a specific embodiment, the descriptions of other embodiments and of the summary of the disclosure may be referred to.

Embodiments will be described with reference to the figures below.

FIG. 1 shows a schematic view of a particle beam system 1. The particle beam system 1 comprises a particle beam source 3 that includes a particle emitter 5 and a driver 7. The particle emitter 5 may be, for example, a cathode heated by the driver 7 via conductors 9 and emitting electrons that are accelerated in a direction away from the particle emitter 5 by an anode 11 and thus forming a particle beam 13. The driver 7 is controlled by a controller 15 of the particle beam system 1 via a connection line 17. An electrical potential of the particle emitter 5 is set by an adjustable power supply 19 being controlled by the controller 15 via a connection line 21. An electrical potential of the anode 11 is set by an adjustable power supply 23 being controlled by the controller 15 via a connection line 25. A difference between the electrical potential of the particle emitter 5 and the electrical potential of the anode 11 defines the kinetic energy of the particle beam 13 after passing through the anode 11. The anode 11 constitutes the upper end of a beam tube 27. The particles of the particle beam 13 enter the beam tube 27 after passing through the anode 11.

The particle beam system 1 includes an optical axis 14 along which the particle beam 13 travels. The optical components of the particle beam system 1 are arranged symmetrically around the optical axis 14.

The particle beam 13 passes through a condenser lens 29 collimating the particle beam 13. In the case shown in FIG. 1, the condenser lens 29 is a magnetic lens with a coil 31 that is excited by the current provided by an adjustable power supply 33. The power supply 33 is controlled by the controller 15 via the connection line 35.

The particle beam 13 then passes through a through-hole 37 in an in-lens detector 39. The in-lens detector 39 is connected with the controller 15 via a connection line 41, such that the in-lens detector 39 can transmit readings representing a number of electrons incident on the in-lens detector 39 to the controller 15 for further processing. In FIG. 1, the in-lens detector 39 is depicted between the condenser lens 29 and an objective lens 43. However, the in-lens detector 39 may be arranged at other locations of the particle beam system 1, as long as the in-lens detector 39 is arranged between a front electrode 53 and the particle source 3. For example, the in-lens detector 39 may be arranged between the front electrode 53 and a lower end 51 of the beam tube 27.

Then, the particle beam 13 passes through the objective lens 43. In the case of FIG. 1, the objective lens 43 comprises a magnetic lens. The magnetic field of the magnetic lens is generated by a coil 45 that is excited by a power supply 47 controlled by the controller 15 via a connection line 49. The objective lens 43 further comprises an electrostatic lens. The electrical field of the electrostatic lens is generated between a lower end 51 of the beam tube 27 and the front electrode 53. The beam tube 27 is electrically connected to the anode 11 and the front electrode 53 may be electrically connected to a ground potential or an additional power supply controlled by the controller 15 via an additional connection line not shown in FIG. 1, such that the electrical potential of the electrode is different from the ground potential. The objective lens 43 focuses the particle beam 13 in a focal plane 55 arranged a working distance f away from the objective lens 43. For example, the working distance f is the distance between the focal plane 55 and the front electrode 53 of the objective lens 43. Since the controller 15 controls the adjustable power supply 47 of the objective lens 43, the working distance f can be adjusted by the controller 15.

A sample 57 is held on a sample holder 59 at a distance s from the objective lens 43. For example, the distance s is the distance between the sample 57 and the front electrode 53. The electrical potential of the sample holder 59 can be set by a power supply 61 controlled by the controller 15 via a connection line 63. The sample 57 is electrically connected with the electrical potential of the sample holder 59, such that the sample 57 has the electrical potential of the sample holder 59. A difference between the electrical potential of the particle emitter 5 and the electrical potential of the sample 57 defines the kinetic energy of the particles of the particle beam 13 incident on the on the sample 57. Inside of the beam tube 27, and when passing through the condenser lens 29 and the objective lens 43, the particles can have a higher kinetic energy, in the case they are decelerated by the electrostatic field between the lower end 51 of the beam tube 27 and the front electrode 53 and/or by an electrical field between the front electrode 53 and the sample 57.

The electrical field between the lower end 51 of the beam tube 27 and the front electrode 53 and/or the electrical field generated between the front electrode 53 and the sample 57 may be generated such that a direction in which secondary electrons emitted from the sample 57 is changed to a direction towards the entry at the lower end 51 of the beam tube 27. As a result, secondary electrons emitted from the sample 57 enter the beam tube 27. The secondary electrons then pass the objective lens 43 and have a high probability to hit the in-lens detector 39, where they are detected. Only secondary electrons that are emitted from the sample 57 close to the optical axis 14 in a direction towards the through-hole 37 of the in-lens detector 39 may pass through the through-hole 37.

The sample holder 59 comprises an actuator 65 that is controlled by the controller 15 via a connection line 67 to mechanically move the sample holder 59 in a vertical direction, such that the distance s can be adjusted.

The particle beam system 1 further comprises a deflection mechanism 69 controlled by the controller 15 via the connection line 71 and deflecting the particle beam 13 by an angle α such that the particle beam 13 can be scanned across an area on the sample 57 under the control of the controller 15. It has to be noted that the particle beam 13 may be deflected by the angle α by another deflection mechanism than the deflection mechanism 69. In other words, the angle α is not necessarily generated by the deflection mechanism 69 that is used to scan the particle beam 13 across an area on the sample. For example, the particle beam 13 may be deflected by the angle α by a deflection mechanism that is used to correct aberration effects in the particle beam system 1. The particles of the particle beam 13 incident on the sample 57 result in the sample 57 emitting secondary electrons. The secondary electrons are accelerated into the beam tube 27 by the electrostatic field provided by the front electrode 53, pass through the condenser lens 43 and hit the in-lens detector 39. Readings of the in-lens detector 39 are transmitted via the connection line 41 to the controller 15. The controller 15 comprises a storage 73, in which the controller 15 stores data derived from the transmitted readings in association with the current setting of the deflection mechanism 69 during the scanning process, such that the data can be e.g. processed to an image of the scanned area of the sample 57. The data stored in the storage 73 may be data associated with only two or a similarly small amount of different settings of the deflection mechanism 69. The storage 73 may comprise instructions that cause the controller 15 of the particle beam system 1 to execute the herein described method when read by the controller 15. The storage 73 may also store a program that performs, upon execution by the controller 15 of the particle beam system 1, the herein described method.

Figure 2:
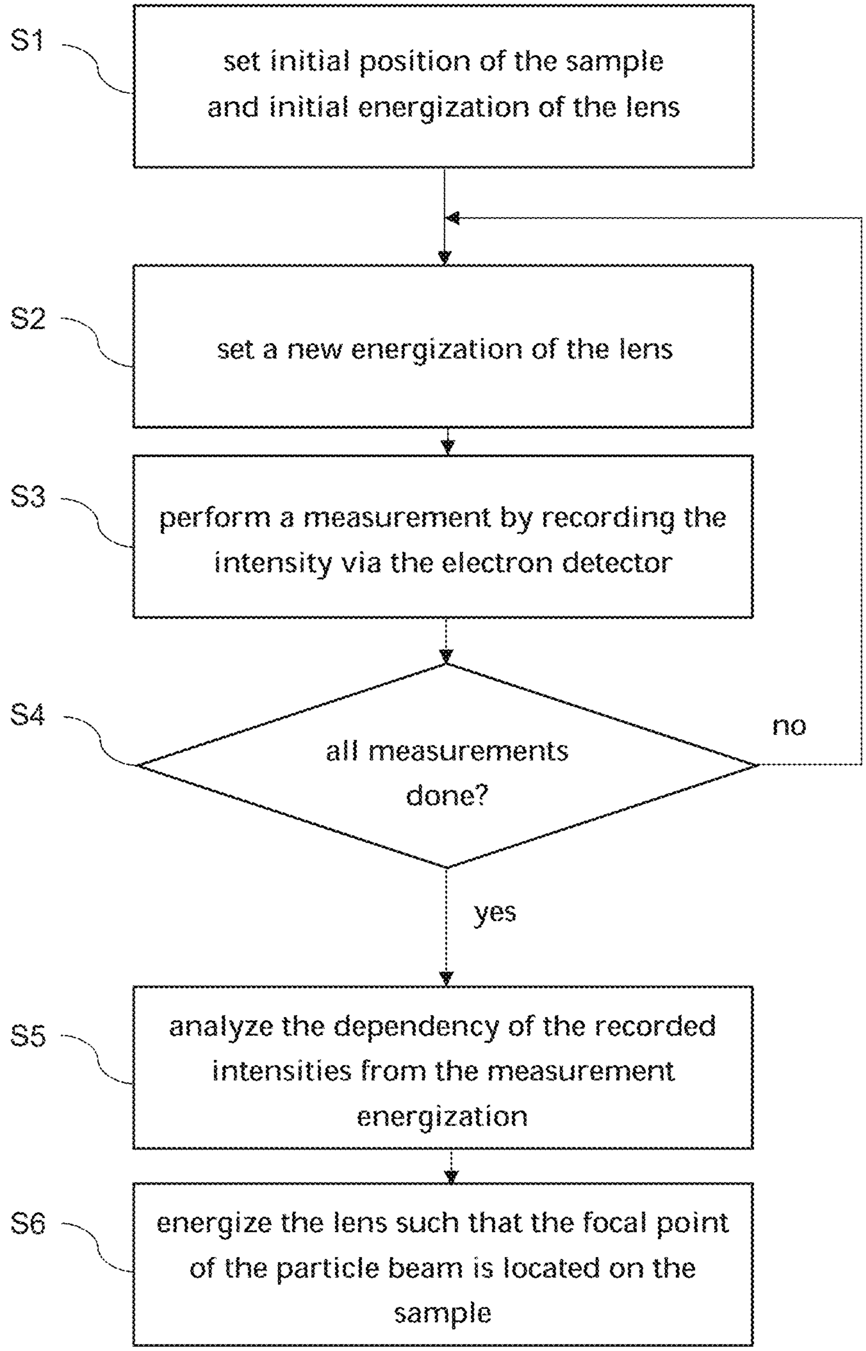
FIG. 2 shows a flow diagram of a method of operating a particle beam system.

A method will be described below with reference to FIG. 2. FIG. 2 shows a flow diagram of a method of operating the particle beam system 1 described with reference to FIG. 1 above.

In a step S1, the controller 15 instructs the actuator 65 to move the sample holder 59 to an initial position, which is maintained during steps S2 to S4. In addition, the controller 15 instructs the power supply 47 to provide an initial current to the objective lens 43, such that an initial energization of the objective lens 43 is set.

The controller 15 then continues with a step S2. In step S2, a new energization of the objective lens 43 is set, such that the energization is different from a previous energization. The newly set energization of the objective lens 43 may be, for example, an energization from a predetermined list of measurement energizations. As an example, a list of energizations to be used in the method can be determined between steps S1 and S2.

This list of measurement energizations may be a list of current values supplied to the coil 45. The list of measurement energizations may also be predetermined and stored in the storage 73. In this case, the stored list of measurement energizations can be read by the controller 15 from the storage between step S1 and step S2. However, as alternative solutions, a single entry of the stored list of measurement energizations can be read by the controller 15 from the storage 73 in step S2, such that a single new energization is read and used as the new energization of the objective lens 43. In addition, the new energization of the objective lens 43 may be determined together with setting the new energization of the objective lens 43 in step S2.

Afterwards, in a step S3, a reading of the in-lens detector 39 is transmitted to the controller 15 via the connection line 41 and stored as an intensity value in the storage 73. For example, the intensity value is stored such that it can be associated with the set position of the sample 57 and the set energization of the objective lens 43. For example, the energization of the objective lens 43 can be stored as a current value supplied to the coil 45 of the objective lens 43. Similarly, the position of the sample 57 can be stored as the distance of the sample 57 from a reference position. The reference position can be given by limitations of the actuator 65, such as the lowermost position of the sample holder 59.

In a step S4, the controller 15 decides whether all measurements of step S3 to be performed have already been performed. If not all measurements to be performed have already been performed ("no" in step S4), the controller 15 returns to step S2, such that all measurements to be performed are iteratively performed by step S3. It is important to note that, if a list of measurement energizations of the objective lens 43 is determined between steps S1 and S2 as described above, the determining of the list of measurement energizations is not included in the iterative execution of steps S2 to S4. In addition, if a single new energization of the objective lens 43 is determined or read from the storage 73 together with step S2, this determining or reading is included in the iterative execution of steps S2 to S4.

If a list of measurement energizations of the objective lens 43 is determined or read from the storage 73 by the controller 15 as described above, the controller 15 may write each set energization of the objective lens 43 in step S2 into a temporary storage (not shown in FIG. 1). The controller 15 can then check in step S4 whether all entries of the list of measurement energizations are written in the temporary storage. In other words, the controller 15 can check in step S4 whether all desirable energizations of the objective lens 43 have been measured.

If the controller 15 determines in step S4 that all measurements to be performed have already been performed ("yes" in step S4), the controller 15 continues with step S5. In step S5, the controller 15 analyzes the dependency of the recorded intensities of step S3 from the measurement energization. For example, the controller 15 can determine a function of the intensity versus the energization of the objective lens 43 and analyze properties of the determined function. The analysis of the dependency of the recorded intensities from the measurement energization will be described later with reference to FIG. 4.

Step S5 can alternatively be performed before step S4. In this case, the iterative execution of steps S2 to S4 further comprises step S5. For example, the controller 15 can determine a function of the intensities recorded so far versus the measurement energizations used so far in each execution of the steps S2, S3, S5 and S4. The controller 15 can then analyze properties of the determined function. For example, the controller 15 can use the determined function and/or the analyzed properties of the determined functions in step S4 to determine whether a desirable setting of the particle beam system 1 has been achieved. If the desirable setting of the particle beam system 1 has been achieved, the controller 15 continues with further steps of the method ("yes" in step S4). If the desirable setting of the particle beam system 1 has not been achieved, the controller 15 returns to step S2 ("no" in step S4). The desirable setting of the particle beam system 1 may be, for example, a setting in which the particle beam spot is at least small.

In a step S6, the controller 15 energizes the objective lens 43 such that a particle beam spot of the particle beam 13 on the sample 57 is at least small. In addition or as an alternative, the controller 15 can position the sample 57 such that the particle beam spot of the particle beam 13 on the sample 57 is at least small. However, according to some embodiments, step S6 does not necessarily have to be performed. For example, in the above described case, in which step S5 is performed before step S4, the controller 15 may stop the method in step S4 when the particle beam spot is at least small. In this case, the energization of the objective lens 43 and the position of the sample 57 does not necessarily have to be adjusted in step S6.

After the particle beam system 1 has a setting in which the particle beam spot is at least small, a task can be performed with the particle beam system 1. This task may comprise an acquisition of data with the particle beam system 1 from which the particle beam spot can be precisely minimized. For example, multiple images can be acquired by scanning the particle beam 13 across the sample 57 with different energizations of the objective lens 43 in a small range around the currently set energization and different positions of the sample 57 in a small range around the currently set position of the sample 57. The multiple images are then compared to each other in terms of a gradient between pixels, such that the energization of the objective lens 43 and the position of the sample 57 used for the image with optimal gradients can be selected as optimal settings for the particle beam system 1. Another task can be performed after setting the optimal settings in the particle beam system 1.

Figure 3:
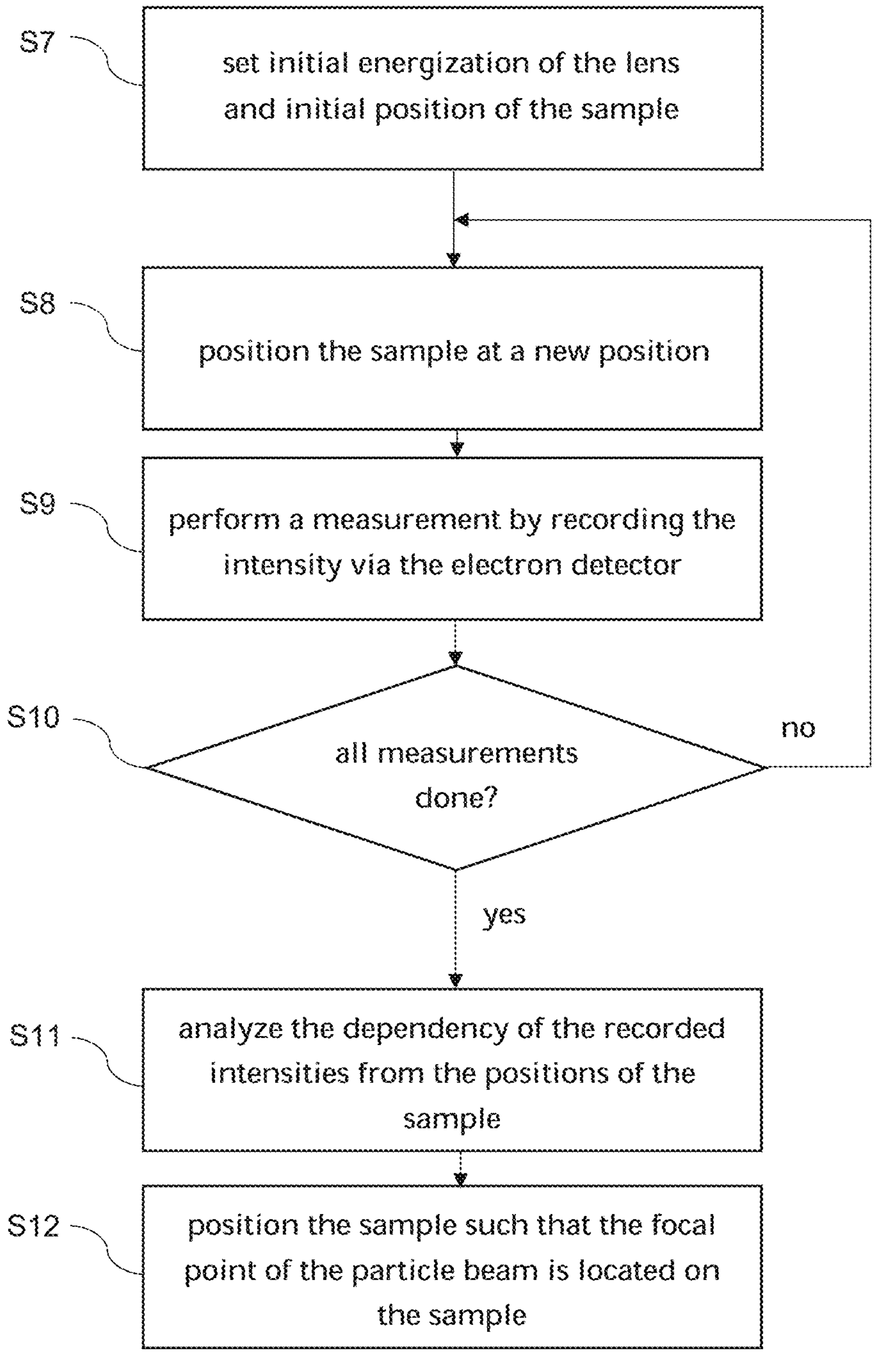
FIG. 3 shows a flow diagram of a method of operating a particle beam system.

A method will be described below with reference to FIG. 3. FIG. 3 shows a flow diagram of the method of operating the particle beam system 1 described with reference to FIG. 1 above. For example, the method in FIG. 3 differs from the method in FIG. 2 in that the position of the sample 57 is iteratively varied instead of the energization of the objective lens 43.

In a step S7, the controller 15 sets an initial energization of the objective lens 43. This is, the controller 15 instructs the power supply 47 to supply an initial current to the coil 45 of the objective lens 43, which is then maintained at least during steps S8 to S10. The controller 15 also sets an initial position of the sample 57.

The controller 15 then continues with a step S8. In step S8, the sample 57 is positioned at a new position, such that the position of the sample 57 is different from a previous position of the sample 57. The new position of the sample 57 may be, for example, a position from a previously determined list of measurement positions. As an example, a list of positions to be used in the method can be determined between steps S7 and S8. This list of measurement positions may be a list of positions of the sample 57 regarding a reference position, which may be the lowermost position of the sample holder 59. The list of measurement positions may also be predetermined and stored in the storage 73. In this case, the stored list of measurement positions can be read by the controller 15 from the storage between step S7 and step S8. However, as alternative solutions, a single entry of the stored list of measurement positions can be read by the controller 15 from the storage 73 in step S8, such that a single new position is read and used as the new position of the sample 57. In addition, the new position of the sample 57 may be determined together with positioning the sample 57 at the new position in step S8.

Afterwards, in step S9, a reading of the in-lens detector 39 is transmitted to the controller 15 via the connection line 41 and stored as an intensity value in the storage 73. For example, the intensity value is stored such that it can be associated with the set position of the sample 57 and the set energization of the objective lens 43. For example, the energization of the objective lens 43 can be stored as a current value supplied to the coil 45 of the objective lens 43. Similarly, the position of the sample 57 can be stored as a distance of the sample 57 from a reference position. The reference position can be given by limitations of the actuator 65, such as the lowermost position of the sample holder 59.

In a step S10, the controller 15 decides whether all measurements of step S9 to be performed have already been performed. If not all measurements to be performed have already been performed ("no" in step S10), the controller 15 returns to step S8, such that all measurements to be performed are iteratively performed by step S9. It is important to note that, if a list of measurement positions of the sample 57 is determined between steps S7 and S8 as described above, the determining of the list of measurement positions is not included in the iterative execution of steps S8 to S10. In addition, if a single new position of the sample 57 is determined or read from the storage 73 together with step S8, this determining or reading is included in the iterative execution of steps S8 to S10.

If a list of measurement positions of the sample 57 is determined or read from the storage 73 by the controller 15 as described above, the controller 15 may write each position of the sample 57 in step S8 into a temporary storage, which is not shown in FIG. 1. The controller 15 can then check in step S10 whether all entries of the list of measurement positions are written in the temporary storage. In other words, the controller 15 can check in step S10 whether all desirable positions of the sample 57 have been measured.

If the controller 15 determines in step S10 that all measurements to be performed have already been performed ("yes" in step S10), the controller 15 continues with step S11. In step S11, the controller 15 analyzes the dependency of the recorded intensities of step S9 from the measurement position. For example, the controller 15 can determine a function of the intensity versus the position of the sample 57 and analyze properties of the determined function. The analysis of the dependency of the recorded intensities from the measurement positions will be described later with reference to FIG. 4.

It has to be noted that step S11 can alternatively be performed before step S10. In this case, the iterative execution of steps S8 to S10 further comprises step S11. For example the controller 15 can determine a function of the intensities recorded so far versus the measurement positions used so far in each execution of the steps S8, S9, S11 and S10. The controller 15 can then analyze properties of the determined function. For example, the controller 15 can use the determined function and/or the analyzed properties of the determined functions in step S4 to determine, whether a desirable setting of the particle beam system 1 has been achieved. If the desirable setting of the particle beam system 1 has been achieved, the controller 15 continues with further steps of the method ("yes" in step S10). If the desirable setting of the particle beam system 1 has not been achieved, the controller 15 returns to step S2 ("no" in step S4). The desirable setting of the particle beam system 1 may be, for example, a setting in which the particle beam spot is at least small.

In a step S12, the controller 15 positions the sample 57 such that a particle beam spot of the particle beam 13 on the sample 57 is at least small. In addition or as an alternative, the controller 15 can energize the objective lens 43 such that the particle beam spot of the particle beam 13 on the sample 57 is at least small. However, according to some embodiments, step S12 does not necessarily have to be performed. For example, in the above described case, in which step S11 is performed before step S10, the controller 15 may stop the method in step S10 when the particle beam spot is at least small. In this case, the energization of the objective lens 43 and the position of the sample 57 does not necessarily have to be adjusted in step S12.

After the particle beam system 1 has a setting in which the particle beam spot is at least small, a task can be performed with the particle beam system 1. This task may comprise an acquisition of data with the particle beam system 1 from which the particle beam spot can be precisely minimized. For example, a precise minimization of the particle beam spot equates to a case, in which the working distance f is substantially equal to the distance s of the sample 57 from the objective lens 43. As an example, multiple images can be acquired by scanning the particle beam 13 across the sample 57 with different energizations of the objective lens 43 in a small range around the currently set energization and different positions of the sample 57 in a small range around the currently set position of the sample 57. The multiple images are then compared to each other in terms of a gradient between pixels, such that the energization of the objective lens 43 and the position of the sample 57 used for the image with optimal gradients can be selected as optimal settings for the particle beam system 1. Another task can be performed after setting the optimal settings in the particle beam system 1.

Figure 4:
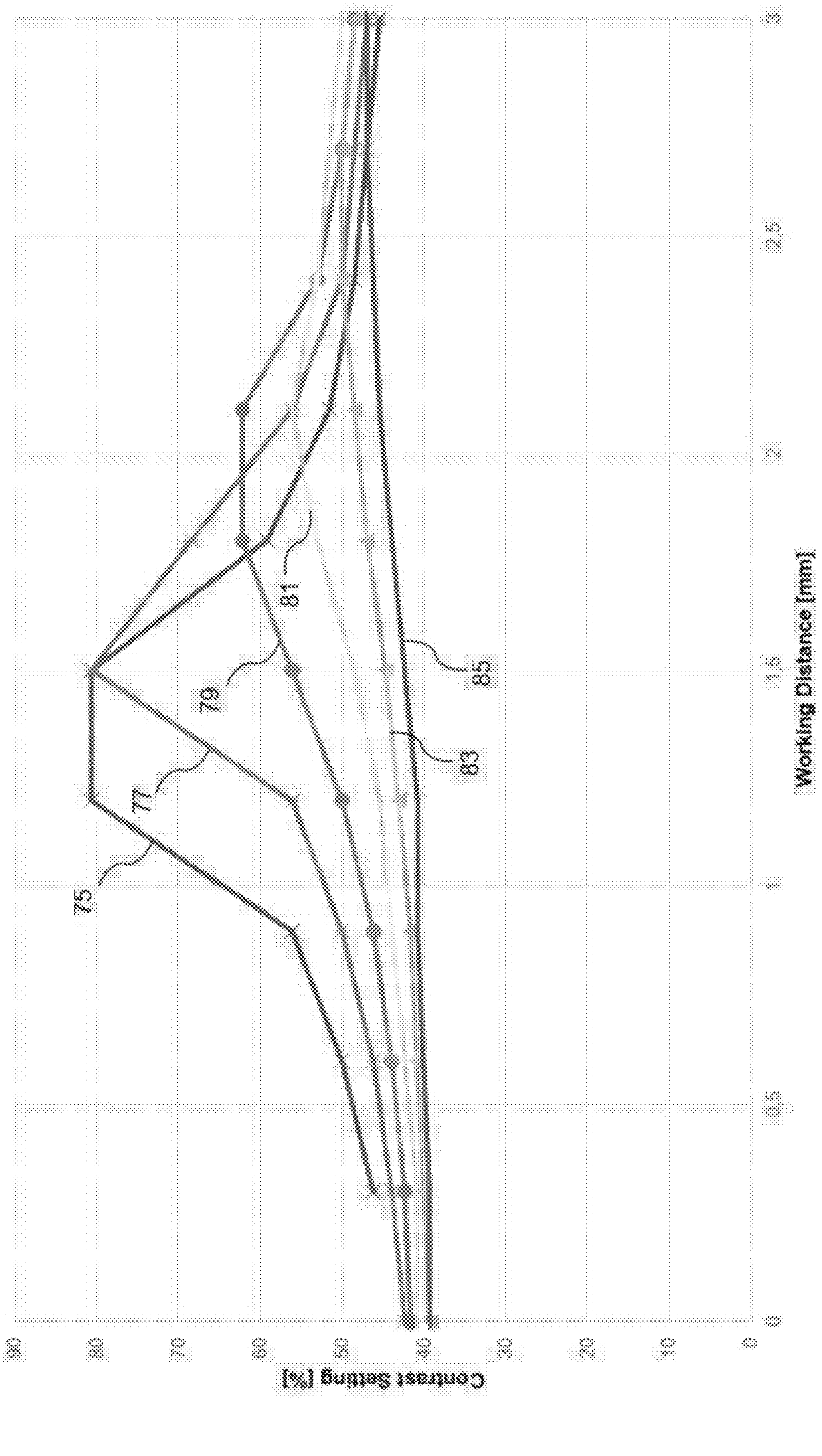
FIG. 4 shows measurement data showing a dependency of a number of electrons incident on an in-lens detector from a working distance and a distance of a sample from a lens.

The analysis of the dependency of the recorded intensities from the energizations of the objective lens 43 or from the positions of the sample 57 will now be described with reference to FIG. 4. FIG. 4 shows measurement data showing a dependency of the number of electrons incident on the in-lens detector 39 from the working distance f and the distance s of the sample 57 from the objective lens 43.

In the empirical measurement shown in FIG. 4, the used particle beam system 1 was a ZEISS GeminiSEM 500. The sample used was a silicon chip. The empirical measurement of FIG. 4 is an example of a result of an experiment as described above. However, the data shown in FIG. 4 may also be obtained by computation. For example, the functional behavior of the data shown in FIG. 4 can be entered to a computer, which then generates data corresponding to the data shown in FIG. 4, thus performing a simulation as described above.

In FIG. 4, instead of intensities, the reading of the in-lens detector 39 and thus the number of electrons incident on the in-lens detector 39 is represented by a contrast setting in percent, instead of an intensity value as described above. The contrast setting is indicative of a difference between high pixel values and low pixel values. The readings of the in-lens detector 39 are represented by the contrast setting of the particle beam system 1 if the contrast setting is adjusted for each measurement such that the intensity is held constant over the measurements. The contrast setting is shown on the vertical axis and the working distance f between the focal plane 55 and the objective lens 43 is shown on the horizontal axis of FIG. 4.

The dependency of the contrast setting from the distance s of the sample 57 from the objective lens 43 is indicated by a plurality of graphs. The graph 75 illustrates a measurement with a distance s of 0.8 mm, the graph 77 illustrates a measurement with a distance s of 1 mm, the graph 79 illustrates a measurement with a distance s of 1.2 mm, the graph 81 illustrates a measurement with a distance s of 1.4 mm, the graph 83 illustrates a measurement with a distance s of 1.6 mm, and the graph 85 illustrates a measurement with a distance s of 1.8 mm.

The shape of each of the graphs 75, 77, 79, 81, 83 and 85 in FIG. 4 is different from the shape of another of the graphs 75, 77, 79, 81, 83 and 85. This means that the dependency of the contrast setting from the working distance f and the distance s of the sample 57 from the objective lens 43 is in fact a two-dimensional dependency as described above.

After the data of the graphs 75, 77, 79, 81, 83 and 85 has been measured, the data is normalized such that it is representative of the shape of the graphs 75, 77, 79, 81, 83 and 85. The normalized data can then be stored in the storage 73.

While performing step S5 in the method of FIG. 2, the controller 15 may read the normalized data from the storage 73. Then, the data read from the storage 73 can be compared to the data acquired by the step S3. This may be realized by first normalizing the data acquired by step S3 and then computing a root-mean-square deviation of the data acquired in step S3 from the data corresponding to each of the graphs 75, 77, 79, 81, 83 and 85. Thus, from the normalized data read from the storage 73, the data corresponding to the graph with the highest correspondence in shape compared to the measured data in step S3 can be selected. Alternatively, it may be sufficient to determine a slope or a location of the maximum of the normalized data and compare this slope or this location of the maximum with a slope or a location of the maximum of the graphs 75, 77, 79, 81, 83 and 85. For example, the graphs 75, 77, 79, 81, 83 and 85 may be a linear graph determined from two data points. The steps S2 to S4 may then be performed two times, resulting in two data points from which a linear dependency can be determined. Thus, in this case, it is sufficient to compare the slopes of the linear dependencies.

As a result, in the case of an experiment similar to FIG. 4, the distance s of the sample 57 from the objective lens 43 is known from the selected data. In addition, an identification of each of the graphs 75, 77, 79, 81, 83 and 85 with a respective energization of the objective lens 43 can be determined during the experiment, such that the energization of the objective lens 43 can be determined from the selected data during step S5. The identification may be determined from the shape of the graphs 75, 77, 81, 83 and 85, for example, the energization of the lens may be the energization used in the experiment at an inflection point of the graphs 75, 77, 81, 83 and 85. Thus, the position of the sample 57 and the energization of the objective lens 43, at which the particle beam spot is at least small, can be determined from the measurements of step S3. Step S11 can be performed similarly to the above, with the measurements of step S9.

A method will be described below with reference to FIG. 5 and FIG. 6. FIG. 6 shows an image acquired by a particle beam system 1. In FIG. 6, the dependency of the number of electrons incident on the in-lens detector 39 is visible. As already described above, if the deflection angle α is small, the particle beam 13 is incident on the sample 57 at a location near the optical axis 14 of the particle beam system 1. Thus, secondary electrons emitted from the sample 57 are likely to be emitted substantially along the optical axis 14, therefore traversing the through-hole 37 of the in-lens detector 39. Those secondary electrons can thus not be detected. As a result, the intensity shown in FIG. 6 is low near the optical axis. Thus, the number of electrons incident on the in-lens detector 39 depends on the direction under which the particle beam 13 is directed onto the sample 57. Because of this, measurements differ between different directions under which the particle beam 13 is directed onto the sample 57. This effect may further be used to minimize the particle beam spot, as it will now be described.

Figure 5:
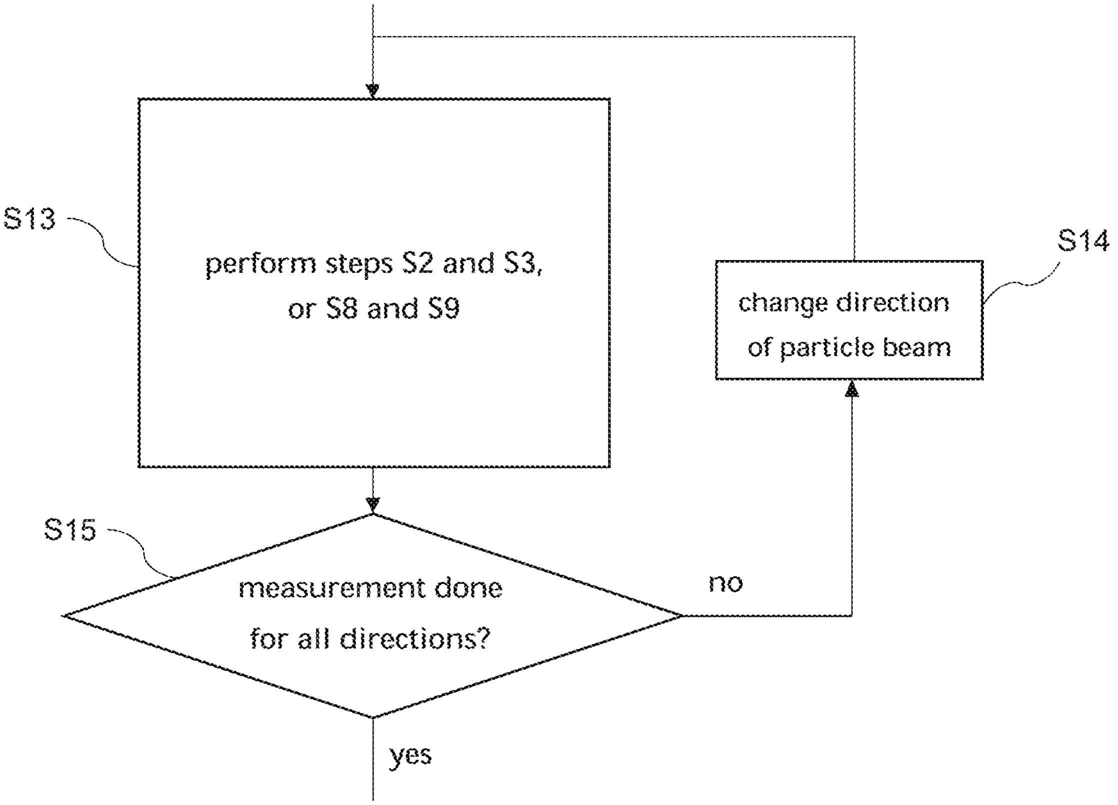
FIG. 5 shows a partial flow diagram of a method of operating a particle beam system.
Figure 6:
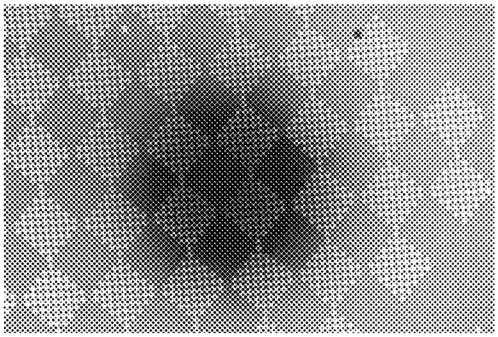
FIG. 6 shows an image acquired by a particle beam system.

FIG. 5 shows a partial flow diagram of the method of operating the particle beam system 1 described with reference to FIG. 1 according to another embodiment. Since several steps shown in FIG. 5 are identical to steps shown in FIGS. 2 and 3, a redundant description will be omitted. This is indicated in FIG. 5 by open-ended lines at the top and bottom of FIG. 5, as well as mentioning the steps S2, S3, S8 and S9 in a step S13.

In step S13, the controller 15 performs either the steps S2 and S3 already described with reference to FIG. 2, or the steps S8 and S9 already described with reference to FIG. 3. Those steps equate to performing a measurement with a new setting of the particle beam system 1 by recording the intensity via the electron detector 39.

Then, between the steps S3 and S4 shown in FIG. 2, or between the steps S9 and S10 shown in FIG. 3, the controller 15 additionally decides in a step S15 whether the measurement has been performed for all directions under which the particle beam 13 is directed onto the sample 57. The direction of the particle beam 13 can be, for example, represented by a value of a voltage supplied to the deflection mechanism 69. The controller 15 may determine whether the measurement has been performed for all directions under which the particle beam 13 is directed onto the sample 57 by comparing the voltage values of the previously performed measurements with a list of voltage values stored in the storage 73.

If the measurement has been performed for all directions under which the particle beam 13 is to be directed onto the sample 57 ("yes" in step S15), the controller proceeds with the remaining steps shown in FIG. 2 or FIG. 3. If the measurement has not been performed for all directions under which the particle beam 13 is to be directed onto the sample 57 ("no" in step S15), the controller 15 proceeds with a step S14. In step S14, the controller 15 changes the voltage that is supplied to the deflection mechanism 69 via the connection line 71. Due to the change in voltage, the particle beam 13 is deflected differently by the deflection mechanism 69 and is thus incident on a different point on the sample 57. The controller 15 then repeats step S13 until the measurement is performed for all directions under which the particle beam 13 is to be directed onto the sample 57. In other words, the controller 15 performs, in each iterative step of the methods previously described with reference to FIG. 2 and FIG. 3, an iterative measurement for a plurality of directions of the particle beam 13.

In some embodiments, step S13 may also include step S4 and step S10, respectively. In this case, the iterative measurement for all energizations of the objective lens 43, or the iterative measurement for all positions of the sample 57 are performed in each iterative step for all directions under which the particle beam 13 is to be directed onto the sample 57. In other words, the controller 15 performs, in each iterative step of the process shown in FIG. 5, the whole iterative measurement previously described with reference to FIG. 2 and FIG. 3.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A particle beam system, comprising:

a particle beam source configured to generate a particle beam;

a lens configured to focus the particle beam in a focal plane, the lens comprising a front electrode closest to the focal plane, the front electrode having an aperture configured to be traversed by the particle beam, a distance between the front electrode and the focal plane being a working distance, an energization of the lens being adjustable to adjust the working distance;

a sample holder configured to hold a sample a distance from the lens;

an electron detector arranged, when seen along a beam path of the particle beam, between the particle beam source and the front electrode such that electrons originating from the sample and having traversed the aperture of the front electrode are incident on the electron detector, the electron detector being configured to generate readings representing a number of electrons incident on the electron detector per unit time, the number of electrons incident on the electron detector per unit time depending on the distance of the sample from the lens and the energization of the lens while the sample is irradiated by a same current of the particle beam; and a controller configured to:

position the sample on the sample holder such that the sample is arranged the distance away from the lens;

perform a measurement for each selected measurement energization of a plurality of measurement energizations, wherein each measurement comprises recording a value derived from a reading of the electron detector while the lens is energized with the selected measurement energization; and analyze a dependency of the recorded values from the plurality of measurement energizations based on the dependency of the number of electrons incident on the electron detector per unit time from the distance of the sample from the lens and from the energization of the lens.

2. The particle beam system of claim 1, wherein the particle beam system is configured so that:

the number of electrons incident on the electron detector per unit time further depends on a direction under which the particle beam is directed onto the sample; and measuring each selected energization of the plurality of measurement energizations comprises:

performing a first measurement for each selected energization of the plurality of measurement energizations with the particle beam being directed in a first direction; and performing a second measurement for each selected energization of the plurality of measurement energizations with the particle beam being directed in a second direction that is different from the first direction, wherein analyzing the dependency of the recorded values is further based on the dependency of the number of electrons incident on the electron detector per unit time from the direction under which the particle beam is directed onto the sample.

3. The particle beam system of claim 1, wherein the controller is configured to do at least one of the following:

determine a first target energization of the lens based on analyzing the dependency of the recorded values, and perform a first task while the energization is maintained at the first target energization; and determine a first target position of the sample relative to the lens based on analyzing the dependency of the recorded values, and perform a first task while the position of the sample relative to the lens is maintained at the first target position.

4. The particle beam system of claim 3, wherein the first task comprises scanning the particle beam across the sample while recording readings of the electron detector.

5. The particle beam system of claim 3, wherein the first task comprises:

recording readings of the electron detector; and at least one of the following:

determining a second target energization of the lens based on the recorded readings, and performing a second task while the energization is maintained at the second target energization; and determining a second target position of the sample relative to the lens based on the analyzing of the recorded readings, and performing a second task while the position of the sample relative to the lens is maintained at the second target position.

6. The particle beam system of claim 5, wherein the second task comprises scanning the particle beam across the sample while recording readings of the electron detector.

7. The particle beam system of claim 1, wherein the controller is configured to determine the dependency of the number of electrons incident on the electron detector per unit time from the distance of the sample from the lens and from the energization of the lens.

8. The particle beam system of claim 1, wherein the controller is configured to simulate the particle beam system to determine the dependency of the number of electrons incident on the electron detector per unit time from the distance of the sample from the lens and from the energization of the lens.

9. The particle beam system of claim 1, wherein the electron detector comprises an electron detecting substrate arranged adjacent to the particle beam.

10. The particle beam system of claim 1, wherein:

the lens further comprises a further electrode having an aperture traversed by the particle beam;

the further electrode is arranged a distance from the front electrode; and the controller is configured to generate a focusing electric field between the front electrode and the further electrode, the focusing electric field contributing to the focusing of the particle beam.

11. The particle beam system of claim 1, wherein:

the particle beam system further comprises a storage storing data representing the dependency of the number of electrons incident on the electron detector per unit time from the distance of the sample from the lens and from the energization of the lens from the storage of the particle beam system; and analyzing the dependency of the recorded values comprises reading the data from the storage.

12. A particle beam system, comprising:

a particle beam source configured to generate a particle beam;

a lens configured to focus the particle beam in a focal plane, the lens comprising a front electrode closest to the focal plane, the front electrode having an aperture configured to be traversed by the particle beam, a distance between the front electrode and the focal plane being a working distance, an energization of the lens being adjustable to adjust the working distance;

a sample holder configured to hold a sample a distance from the lens;

an electron detector arranged, when seen along a beam path of the particle beam, between the particle beam source and the front electrode such that electrons originating from the sample and having traversed the aperture of the front electrode are incident on the electron detector, the electron detector being configured to generate readings representing a number of electrons incident on the electron detector per unit time, the number of electrons incident on the electron detector per unit time depending on the distance of the sample from the lens and the energization of the lens while the sample is irradiated by a same current of the particle beam; and a controller configured to:

energize the lens with an energization to focus the particle beam in a plane at a working distance from the lens;

perform a measurement for each selected position of a plurality of measurement positions of the sample, wherein each measurement comprises recording a value derived from a reading of the electron detector while the sample is located at the selected position; and analyze a dependency of the recorded values from the plurality of measurement positions of the sample based on the dependency of the recorded values is based on the dependency of the number of electrons incident on the electron detector per unit time from the distance of the sample from the lens and from the energization of the lens.

13. The particle beam system of claim 12, wherein the controller is configured to do at least one of the following:

determine a first target energization of the lens based on analyzing the dependency of the recorded values, and performing a first task while the energization is maintained at the first target energization; and determine a first target position of the sample relative to the lens based on analyzing the dependency of the recorded values, and perform a first task while the position of the sample relative to the lens is maintained at the first target position.

14. The particle beam system of claim 13, wherein the first task comprises scanning the particle beam across the sample while recording readings of the electron detector.

* * * * *